United States Patent
Hayworth et al.

(10) Patent No.: US 6,823,734 B1
(45) Date of Patent: Nov. 30, 2004

(54) ELECTROSTATIC SPRING SOFTENING IN REDUNDANT DEGREE OF FREEDOM RESONATORS

(75) Inventors: Ken J. Hayworth, Northridge, CA (US); Kirill V. Shcheglov, Los Angeles, CA (US); Todd E. Humphreys, Ogden, UT (US); A. Dorian Challoner, Manhattan Beach, CA (US)

(73) Assignees: California Institute of Technology, Pasadena, CA (US); The Boeing Company, Chicago, IL (US)

( * ) Notice: Subject to any disclaimer, the term of this patent is extended or adjusted under 35 U.S.C. 154(b) by 0 days.

(21) Appl. No.: 10/423,456

(22) Filed: Apr. 25, 2003

Related U.S. Application Data

(60) Provisional application No. 60/375,749, filed on Apr. 26, 2002.

(51) Int. Cl.[7] ................................................. G01P 9/04
(52) U.S. Cl. ..................................................... 73/504.12
(58) Field of Search ......................... 73/504.12, 504.14, 73/504.02

(56) References Cited

U.S. PATENT DOCUMENTS

| 392,650 | A | 11/1888 | Watrous |
| 5,226,321 | A | 7/1993 | Varnham et al. |
| 5,646,346 | A | 7/1997 | Okada |
| 5,665,915 | A | 9/1997 | Kobayashi et al. |
| 5,783,749 | A | 7/1998 | Lee et al. |
| 5,894,090 | A | 4/1999 | Tang et al. |
| 5,905,202 | A | 5/1999 | Kubena et al. |
| 5,920,012 | A | 7/1999 | Pinson |
| 6,009,751 | A | 1/2000 | Ljung |
| 6,044,705 | A | 4/2000 | Neukermans et al. |
| 6,164,134 | A | 12/2000 | Cargille |
| 6,289,733 | B1 | 9/2001 | Challoner et al. |
| 6,360,601 | B1 | 3/2002 | Challoner et al. |
| 6,367,786 | B1 | 4/2002 | Gutierrez et al. |
| 6,629,460 | B2 * | 10/2003 | Challoner ................. 73/504.02 |

FOREIGN PATENT DOCUMENTS

| DE | 44 42 033 A1 | 5/1996 |
| WO | WO 96/38710 | 12/1996 |
| WO | WO 98/15799 | 4/1998 |

OTHER PUBLICATIONS

D. Wright et al., "The HRG Applied to a Satellite Attitude Reference System," Guidance and Control, American Astronautical Society, Advances in Astronautical Sciences, 1994, 86:1–13.

M.W. Putty et al., "A Micromachined Vibrating Ring Gyroscope," Solid State Sensor and Actuator Workshop, Transducer Research Foundation, Hilton Head, 1994, pp. 213–220.

(List continued on next page.)

*Primary Examiner*—John E. Chapman
(74) *Attorney, Agent, or Firm*—Patent Venture Group

(57) ABSTRACT

The present invention discloses an isolated electrostatic biased resonator gyroscope. The gyroscope includes an isolated resonator having a first and a second differential vibration mode, a baseplate supporting the isolated resonator, a plurality of excitation affixed to the baseplate for exciting the first differential vibration mode, a plurality of sensing electrodes affixed to the baseplate for sensing movement of the gyroscope through the second differential vibration mode and a plurality of bias electrodes affixed to the baseplate for trimming isolation of the resonator and substantially minimizing frequency split between the first and second differential vibration modes. Typically, the isolated resonator comprises a proof mass and a counterbalancing plate with the bias electrodes disposed on the baseplate below.

26 Claims, 3 Drawing Sheets

OTHER PUBLICATIONS

T.K. Tang et al., "Silicon Bulk Micromachined Vibratory Gyroscope," Solid State Sensor and Actuator Workshop, Transducer Research Foundation, Hilton Head, South Carolina, Jun. 2–6, 1996, 6 pgs.

N. Barbour et al., "Micromechanical Silicon Instrument and Systems Development at Draper Laboratory," AIAA Guidance Navigation and Control Conference, American Institute of Aeronautics and Astronautics, San Diego, CA, Jul. 29–31, 1996, Paper No. 96–3709, pp. 1–7.

J.D. Johnson et al., "Surface Micromachined Angular Rate Sensor," A1995 SAE Conference, Paper No. 950358, pp. 77–83.

* cited by examiner

ELECTROSTATIC SPRING SOFTENING IN REDUNDANT DEGREE OF FREEDOM RESONATORS

CROSS-REFERENCE TO RELATED APPLICATIONS

This application claims the benefit under 35 U.S.C. §119 of the following co-pending U.S. provisional patent application, which is incorporated by reference herein:

U.S. Provisional Patent Application No. 60/375,749, by Ken Hayworth et al., filed Apr. 26, 2002, and entitled "ELECTROSTATIC SPRING SOFTENING APPLIED TO ADJUSTING MECHANICAL MODAL FREQUENCIES (AND AXES) AND MECHANICAL QUALITY (Q) FACTOR (AND DAMPENING AXES) IN REDUNDANT DEGREE OF FREEDOM RESONATORS".

This application is related to the following co-pending U.S. utility patent applications, which are all incorporated by reference herein:

U.S. patent application Ser. No. 09/928,279, by A. Dorian Challoner, filed Aug. 10, 2001, and entitled "ISOLATED RESONATOR GYROSCOPE", now issued as U.S. Pat. No. 6,629,460 on Oct. 7, 2003;

U.S. patent application Ser. No. 10/370,953, by A. Dorian Challoner et al., filed Feb. 20, 2003, and entitled "ISOLATED RESONATOR GYROSCOPE WITH A DRIVE AND SENSE PLATE";

U.S. patent application Ser. No. 10/410,744, by A. Dorian Challoner et al., filed Apr. 10, 2003, and entitled "ISOLATED RESONATOR GYROSCOPE WITH COMPACT FLEXURES"; and U.S. patent application Ser. No. 10/423,459, by A. Dorian Challoner et al., filed on Apr. 25, 2003, and entitled "ISOLATED RESONATOR GYROSCOPE WITH ISOLATION TRIMMING USING A SECONDARY ELEMENT".

U.S. patent application Ser. No. 10/410,744, by A. Dorian Challoner et al., filed on this same day herewith, and entitled "ISOLATED RESONATOR GYROSCOPE WITH ISOLATION TRIMMING USING A SECONDARY ELEMENT".

STATEMENT OF GOVERNMENT RIGHTS

This invention was made with Government support awarded by the National Aeronautics and Space Administration (NASA). The Government has certain rights in this invention.

BACKGROUND OF THE INVENTION

1. Field of the Invention

The present invention relates to electrostatic spring softening applied to mechanical resonators, and in particular to improved microgyroscope resonators and their manufacture. More particularly, this invention relates to producing and tuning microgyroscopes, and particularly, isolated resonator gyroscopes.

2. Description of the Related Art

Gyroscopes are used to determine direction based upon the sensed inertial reaction of a moving mass. In various forms they are often employed as a critical sensor for vehicles such as aircraft and spacecraft. They are generally useful for navigation or whenever it is necessary to autonomously determine the orientation of a free object. A number of recent technologies have brought new forms of gyroscopes, including optical gyroscopes such as laser gyroscopes and fiberoptic gyroscopes as well as vibratory gyroscopes. Such vibratory gyroscopes generally operate using electrostatic actuation and sensing, employing controlled capacitance gaps between a moving resonator and a supporting structure, e.g. a baseplate or package. These and other new gyroscopes greatly widen the range of gyroscope applications because they offer increasing performance levels at lower costs.

Some prior vibratory gyroscopes with symmetric designs have been produced, however their vibratory momentum is transferred directly to their baseplates or packages. This coupling admits external disturbances and energy loss indistinguishable from inertial rate input and hence leads to sensing errors and drift. Other planar tuning fork gyroscopes may achieve a degree of isolation of the vibration from the baseplate, however these gyroscopes lack the vibrational symmetry desirable for tuned operation. One example of such a vibratory gyroscope may be found in U.S. Pat. No. 5,894,090 to Tang et al. which describes a symmetric cloverleaf vibratory gyroscope design and is hereby incorporated by reference herein.

Recently, a variety of new resonator gyroscopes have been developed which include a resonator that is isolated from the baseplate or supporting structure. Some of these vibratory gyroscopes include various post resonator gyroscopes such as described in U.S. application 09/928,279, 10/370,953, 10/410,744, by A. Dorian Challoner et al., filed Apr. 10, 2003, and entitled "ISOLATED RESONATOR GYROSCOPE WITH COMPACT FLEXURES" and Ser. No. 10/423,459 by A. Dorian Challoner et al., filed on Apr. 25, 2003, and entitled "ISOLATED RESONATOR GYROSCOPE WITH ISOLATION TRIMMING USING A SECONDARY ELEMENT".

Vibration isolation using a low-frequency seismic support is also known (e.g., U.S. Pat. No. 6,009,751, which is incorporated by reference herein), however such increased isolation comes at the expense of proportionately heavier seismic mass and/or lower support frequency. Both effects are undesirable for compact tactical inertial measurement unit (IMU) applications.

In the case of many of the recent resonator gyroscope which use electrostatic excitation and sensing such as some of those mentioned above, mechanical tuning of the gyroscope modes is often necessary to obtain optimum performance, e.g. navigation grade performance. Mechanical tuning, e.g. laser ablation or focused ion beam machining, of such resonator gyroscopes is very expensive to perform after the manufacturing process. In addition, it is difficult to correct for perturbations which will result from the gyroscope packaging as the mechanical tuning operations are performed prior to final packaging. Such mechanical tuning cannot be used to recalibrate the gyroscope in the field after final packaging.

There is a need in the art for small gyroscopes with greatly improved performance for navigation and spacecraft payload pointing. Further, there is a need for such gyroscopes to be easily tunable and capable of selective control of differential rocking modes and balance control. Still further, there is a need for techniques which allow tuning of such gyroscopes without machining. Finally, there is also a need for gyroscopes and tuning techniques that allow for recalibration in the field after final packaging. These and other needs are met by the present invention.

SUMMARY OF THE INVENTION

The present invention discloses the use of electrostatic spring softening to induce a balanced condition while simultaneously minimizing frequency split. This invention has application to various of vibratory Coriolis force sensing gyroscopes using electrostatic driving and sensing, but particularly those with isolated or balanced resonators. For example, embodiments of the invention can be employed in various isolated resonator gyroscopes such as described in U.S. application Ser. Nos. 09/928,279, 10/370,953, 10/410, 744 by A. Dorian Challoner et al., filed Apr. 10, 2003, and entitled "ISOLATED RESONATOR GYROSCOPE WITH COMPACT FLEXURES" and Ser. No. 10/423,459 by A. Dorian Challoner et al., filed Apr. 25, 2003, and entitled "ISOLATED RESONATOR GYROSCOPE WITH ISOLATION TRIMMING USING A SECONDARY ELEMENT". More generally, the invention can be used in any redundant degree of freedom mechanical resonator in any application which may require one. Typical embodiments of the invention include a balanced redundant degrees-of-freedom resonator structure combined with electrostatic spring softening to tune both mechanical modes (and axes) and mechanical quality (Q) factor (and dampening axes).

One significant advantage of the present invention is that it allows post-manufacture tuning using simple electronics on a fully vacuum packaged gyroscope and can be performed in the field as a calibration routine to compensate for aging, radiation damage and other effects which result in a gradual decay in performance. Thus, the invention can yield an affordable vibratory gyroscope with navigation grade performance by means of a precision isolated symmetric planar resonator of optimum scale that can be fabricated with silicon photolithography from commercial double-side polished silicon wafers with low total thickness variation.

In one exemplary embodiment, the present invention can be employed with an isolated resonator comprising two bodies with transverse inertia symmetry about an axis aligned with an input axis and elastically supported so that their axes of symmetry and centers of mass coincide and together form two differential rocking modes of vibration transverse to the axis of symmetry. The two bodies are supported on a baseplate having an inertial rate input axis and exhibit substantially equal frequencies distinct from other modes of vibration, mutually orthogonal and imparting substantially zero net momentum to the baseplate. Excitation and sense electrodes are disposed below the resonator on the supporting baseplate structure to excite and sense movement of the resonator.

In the exemplary embodiments which follow, a first one of the bodies is a proof mass, a second one of the bodies is a counterbalancing plate. The counterbalancing plate is for reacting with the excitation and sense electrodes. However, other structures and arrangements which can employ the inventive principle of electrostatic spring softening will be apparent to those skilled in the art.

In general, the excitation and sense electrodes are disposed below the counterbalancing plate. The excitation electrodes are aligned to drive a first one of the differential rocking modes to vibrate. The sense electrodes are aligned to sense the motion of the second differential rocking mode induced by Coriolis accelerations resulting from the inertial rate input and internally driven differential rocking motion about the first mode axis.

A key element of the present invention is the incorporation of a plurality of bias electrodes which are used to tune isolation of the resonator from the baseplate and minimize frequency split between the excitation and sensing vibration modes. Typically, the bias electrodes are disposed on the baseplate beneath the two bodies of the resonator to provide a bias against it. The addition of these bias electrodes permits selective control of the differential rocking mode and electrostatic balance control. In addition to isolated resonator gyros, the secondary element is also applicable to other types of vibratory gyroscopes, such as hemispherical resonator gyroscopes.

The present invention discloses an isolated electrostatic biased resonator gyroscope. The gyroscope includes an isolated resonator having a first and a second differential vibration mode, a baseplate supporting the isolated resonator, a plurality of excitation affixed to the baseplate for exciting the first differential vibration mode, a plurality of sensing electrodes affixed to the baseplate for sensing movement of the gyroscope through the second differential vibration mode and a plurality of bias electrodes affixed to the baseplate for trimming isolation of the resonator and substantially minimizing frequency split between the first and second differential vibration modes. Typically, the isolated resonator comprises a proof mass and a counterbalancing plate joined and supported by flexures with the bias electrodes disposed on the baseplate below.

BRIEF DESCRIPTION OF THE DRAWINGS

Referring now to the drawings in which like reference numbers represent corresponding parts throughout.

DETAILED DESCRIPTION INCLUDING PREFERRED EMBODIMENTS

Figure 1:
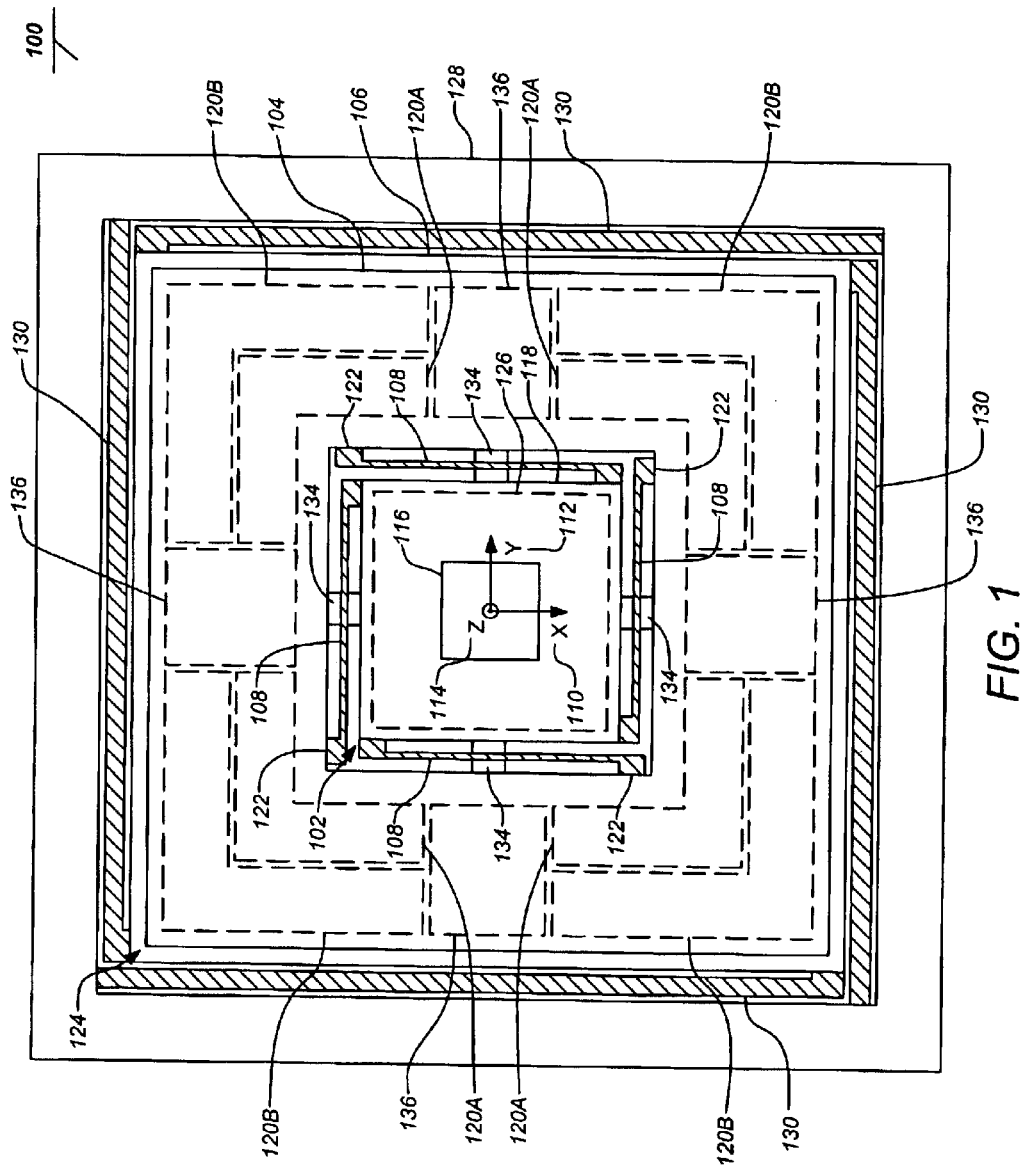
FIG. 1 depicts a top view of an exemplary reactionless resonator gyroscope of the present invention.

In the following description, reference is made to the accompanying drawings which form a part hereof, and which is shown, by way of illustration, several embodiments of the present invention. It is understood that other embodiments may be utilized and structural changes may be made without departing from the scope of the present invention.

1.0 Overview

Gyroscope embodiments of the invention include a plurality of bias electrodes for electrostatic balancing or trimming of the isolation of the differential rocking mode from the baseplate and outer mounting frame which support the resonator. In a typical embodiment, the plurality of bias electrodes are affixed to the baseplate disposed beneath the resonator. The plurality of bias electrodes, in conjunction with the excitation and sense electrodes, permit selective electrostatic control of the differential rocking mode of the gyroscope. In further embodiments, the plurality of bias electrodes can be applied to isolated resonator gyroscopes beyond those employing a central proof mass and counterbalancing plate as described herein.

In one exemplary embodiment of the invention, static voltages are applied to multiple bias electrodes beneath both an inner resonant post and outer resonant plate body. This enables changing the restoring spring matrices associated with each of these two bodies. These static voltages can fully manipulate (within voltage range bounds) the spring axes and spring values of both the inner resonant post and outer resonant plate, a total of six parameters. Models can predict that these are enough parameters to make up for any manufacturing induced inertia or mechanical spring mismatches. and to produce a resonant structure with the desired modes having no inner baseplate motion. The split can theoretically be brought to zero this way, and the resonator mechanical quality (Q) can be brought to a value determined solely by the internal losses due to the materials of the post and plate. Of equal importance, the intrinsic Q (due to such material losses) is more easily modeled over temperature and therefore results in greater overall bias stability for the gyroscope.

Embodiments of the present invention can operate within an isolated planar vibratory gyroscope that provides a desired differential rocking mode vibration of a counterbalancing plate versus a central elongated proof mass, while ensuring that the undesirable common rocking mode frequency is practically separated above the desirable differential mode frequency. Embodiments of the invention include isolation tuning that can be adjusted by altering the elongated proof mass length. The inertias of the proof mass and counterbalancing plate do not have to be as precisely equal.

Further embodiments of the invention also provide integral vibration isolation to the baseplate through additional baseplate isolation flexures, attaching the baseplate to a mounting frame to further improve resonator isolation.

As electrostatic reactions play an important role, typical embodiments of the present invention also use the counterbalancing plate to react with the sense and excitation and bias electrodes, disposed proximate to the counterbalancing plate beneath it. Thus, the counterbalancing plate serves a dual role, forming an isolated resonator with the proof mass and providing a surface for reaction with the various electrodes. In addition, to enhance the operation of the gyroscope, the counterbalancing plate can be structured with extensive planar surface regions to better support electrostatic operation with the electrodes.

Embodiments of the invention generally comprise an all-silicon, isolated symmetric vibratory gyroscope that is inexpensive to produce using photolithography and that can be scaled large enough (e.g., approximately 20 mm resonator) to achieve the required performance. Combined with low-cost, closed-loop, analog control electronics, a complete redundant inertial reference unit can be inexpensively manufactured, even when produced in small quantities. Further, when combined with a low-power digital control electronics application-specific integrated circuit (ASIC) for much larger quantities, a very small inertial navigation unit can be produced. Such a compact, lightweight and inexpensive precision inertial reference unit can find a wide range of applications in military as well as commercial products.

2.0 Exemplary Resonator Gyroscope Embodiment

FIG. 1 depicts a top view of an exemplary isolated resonator gyroscope 100 embodiment of the present invention. The gyroscope 100 comprises a baseplate 106 and a unique resonator 124 which includes a post inertial proof mass 102 and a counterbalancing plate 104. The counterbalancing plate 104 has a rocking inertia substantially comparable to that of the inertial proof mass 102 and these two bodies are interconnected and interact as described above. The counterbalancing plate 104 and central proof mass 102 are coupled to the baseplate 106 at four mounting points 134 and interconnected to each other by way of flexures 108. The principal axes of concern which will be referenced throughout the specification are the X axis 110, the Y axis 112 and the Z axis 114 (which is directed out of the page of FIG. 1). Alternately, the counterbalancing plate 104 can also be designed in any other shape, such as a circular ring or other arbitrary shape so long as the two bodies (inertial proof mass 102 and counterbalancing plate 104) interact as previously described.

Figure 2:
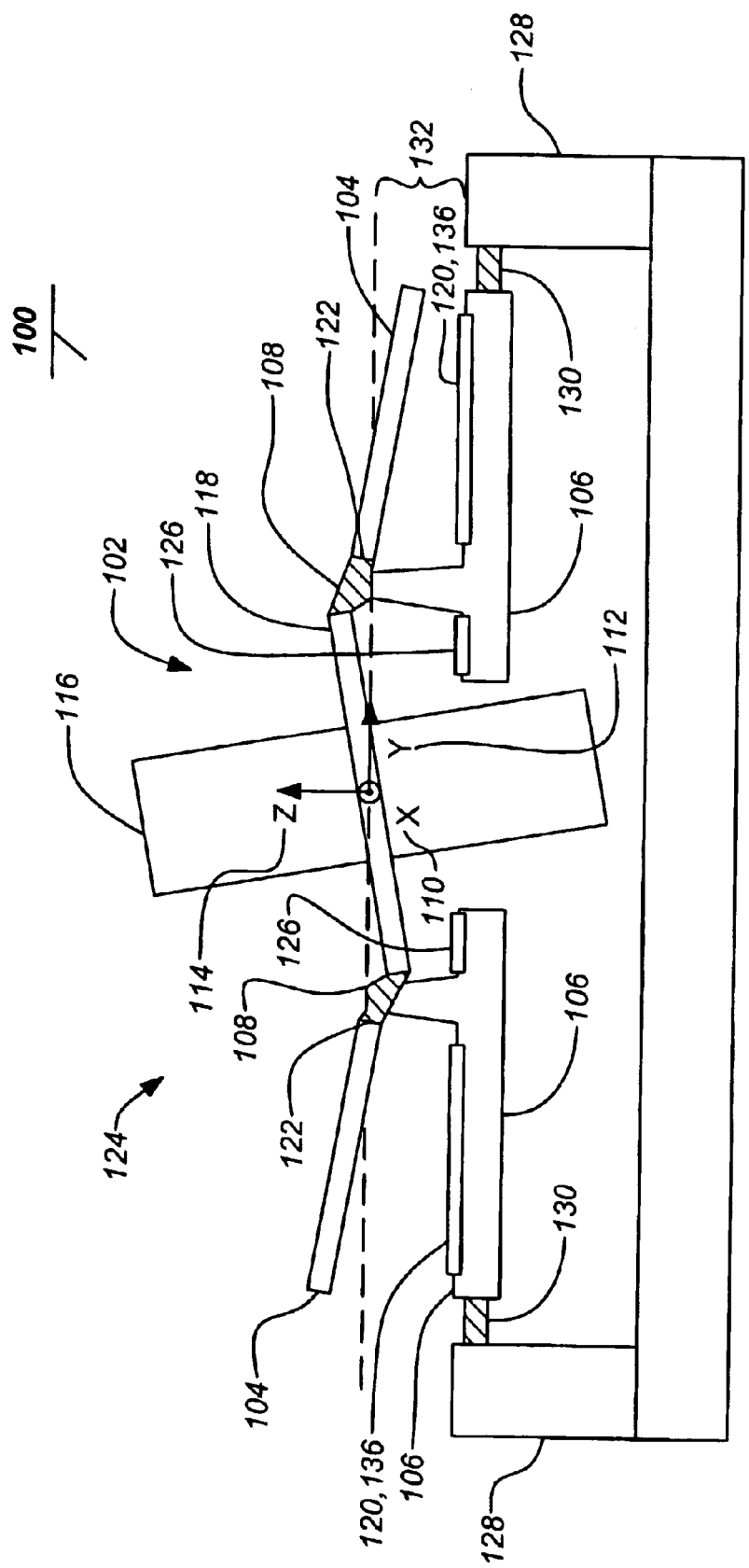
FIG. 2 depicts a side view of the exemplary reactionless resonator gyroscope of the present invention in an exaggerated displaced position.

FIG. 2 depicts side view of an isolated resonator gyroscope 100 of the present invention in a displaced position. The gyroscope is shown displaced about the X axis 110. The mechanical assembly comprises a central inertial proof mass 102 element interconnected to an outer counterbalancing plate 104 and affixed to a baseplate 106 via elastic beam flexures 108 attached at the four mounting points 134. In one embodiment, the counterbalancing plate 104, flexures 108 and support plate 118 for the central inertial proof mass 102 can be photolithographically etched-through from the same double-side polished crystal silicon wafer to produce a precision planar resonator gyroscope.

The axisymmetric resonator 124 is coupled to a baseplate 106 such that the axisymmetric counterbalancing plate 104 can freely vibrate against the axisymmetric central proof mass 102 with counterbalanced oscillatory rocking motion and results in a distinct differential rocking mode with substantially no momentum transfer to or net reaction on the baseplate 106.

The proof mass 102 can be constructed in various forms, however the inertial distribution of the central proof mass is designed to have significantly more mass out of plane than in plane and hence high angular gain, or Coriolis reaction to inertial rate input with driven rocking motion of the resonator 124. To achieve this, the proof mass 102 comprises a vertical post portion 116 (elongated along the Z axis 114). The post portion 116 is disposed on a small central support plate portion 118 (in the X-Y plane). The post portion 116 and support plate portion 118 can be formed together from a thick silicon wafer for manufacturing ease as previously mentioned. Alternately, the proof mass 102 can be bonded as a separable central post portion 116 to the support plate portion 118 of the counterbalancing plate 104 formed from a thin silicon wafer.

As further detailed hereafter, electrostatic excitation and sensing can be implemented with the excitation and sense electrodes 120A, 120B (collectively referred to as electrodes 120) affixed to the baseplate 106 beneath the large planar surfaces of the counterbalancing plate 104. See FIG. 1. The large surface area of the counterbalancing plate 104 is used to react with the driving and sensing electrodes 120. In general, the extensive planar electrode 120 regions can be formed on the baseplate 106 beneath the counterbalancing plate 104. The counterbalancing plate 104 structure extends toward the central proof mass 102 with the flexures 108 arranged around a perimeter of the central proof mass 102 as shown in FIG. 1 to maximize the useful electrostatic reacting area. Thus, the gap between the proof mass 102 and the counterbalancing plate 104 is reduced and the counterbalancing plate 104 obtains a more plate-like configuration.

Also as shown in FIG. 1, a typical arrangement of the excitation and sense electrodes 120A, 120B is for the excitation electrodes 120A to be disposed nearer to the proof mass 102 than the sense electrodes 120B; one excitation electrode 120A and one sense electrode 120B each are disposed on the baseplate 106 under each quarter segment of the counterbalancing plate 104. This can improve the overall sensitivity of the microgyro 100 as the sense electrodes 120B obtain a larger surface area and the gaps around the periphery of the counterbalancing plate 104 undergo larger displacements relative to the baseplate 106. Other electrode 120 patterns can also be used as well, however. For example, the electrodes 120 can be interwoven with each other as well as the bias electrodes 136.

2.1 Isolation Trimming Using a Plurality of Bias Electrodes

All vibratory gyroscopes employ a rotation sensing mechanical element which is excited to oscillate in a first mode, i.e. the input or drive mode. A Coriolis acceleration of the element under rotation induces energy transfer from the input mode to a second mode, i.e. the output or sense mode. The second mode produces an excitation in the sense element which is then detected. Optimum performance of a vibratory gyroscope is obtained when the excitation and sense modes have substantially the same resonant frequency and a high Q factor. The response to the Coriolis acceleration is then mechanically amplified by the Q factor of the resonance and provides improved sensor performance. Closed loop control of the resonator sense mode (e.g U.S. Pat. No. 6,360,601 issued on Mar. 26, 2002, which is hereby incorporated by reference herein) provides Coriolis force-rebalance, sense mode damping and wide gyroscope bandwidth.

Embodiments of the present invention employ bias trimming to modify the overall modal stiffness with a plurality of bias electrodes 126, 136 affixed to the baseplate 106 beneath both the central plate portion 118 and the counterbalancing plate 104 of the resonator 124 structure as shown in FIGS. 1 and 2. The bias electrodes 126, 136 are employed to apply bias voltages to the resonator 124 separately from the excitation and sense electrodes 120A, 120B during operation of the gyroscope. Thus, the bias electrodes 126, 136 can be used to maintain this isolation and tuning after vacuum packaging and at varying temperatures throughout the life of the gyroscope. Although FIG. 1 shows a single bias electrode 126 disposed beneath the central plate portion 118 and four separate bias electrodes 136 disposed beneath the counter balancing plate 104 (one under the middle of each side), this arrangement is only illustrative. Many other patterns and arrangements of the plurality of bias electrodes 126, 136 are possible. For example, multiple separate electrodes can be disposed under the central plate portion 118 (e.g., under the middle of each side) and/or other patterns for the bias electrodes can be employed (e.g., the bias electrodes 136 can be disposed between the excitation and sense electrodes 120).

Embodiments of the invention can be applied to a class of vibratory Coriolis force sensing gyroscopes with isolated or balanced resonator designs such as described in the exemplary embodiment above. The rate sensing element comprises a resonant structure with two vibratory modes offset by approximately 90 degrees. Motion is induced in the "excitation" mode and this motion is transferred to the "sense" mode only under rotation of the gyroscope around its principle axis. The performance of such gyroscopes is highly dependent upon the frequency split between the excitation and sense modes as well as on the Q of the resonant structure; a small frequency split and large Q are desirable.

The exemplary isolated resonator gyroscope 100 described above includes redundant degrees of freedom (i.e., more than the two major rocking degrees of freedom needed to give two modes). Its structure consists of an inner resonant post 116, and outer resonant plate 104, an inner baseplate 106 (also part of the "resonant modes"), and a baseplate frame 128 for mounting to the external world. This provides a total of six major degrees of freedom. The inner resonator post 116 and outer resonant plate 104 inertias and spring constants are designed so that under perfect manufacturing there are two orthogonal modes where the inner baseplate 106 does not move. This means that for those modes the mounting to the external world does not introduce any sensor error sources (i.e., no changes in frequency split, no external dampening losses to lower the Q, and lower sensitivity to external vibration noise).

The manufacturing process discussed in various isolated resonator gyroscopes approaches this optimum condition, but for a navigation quality gyroscope post-manufacturing tuning of the key parameters is necessary. As discussed previously, other gyroscopes have used laser ablation tuning to refine these parameters after manufacture and focused ion beam trimming has been proposed for the same purposes.

Embodiments of the present invention employ the use of electrostatic spring softening to induce the isolation or balance condition while simultaneously minimizing frequency split. This electrostatic biasing technique has great advantage in that the post-manufacture tuning can now be done using simple electronics on a fully vacuum packaged gyro and can even be redone in the field as a calibration routine to account for aging, radiation damage, and other performance degrading effects which occur throughout the life of the resonator.

Electrostatic biasing with the present invention employs static voltages applied to multiple bias electrodes 126, 136 beneath both the inner resonant post 102 and outer resonant plate 104 structures. This allows for changing the restoring spring matrices associated with each of these structures. These static voltages can fully manipulate (within voltage range bounds) the spring axes and spring values of both the inner resonant post 102 and outer resonant plate 104 structures, a total of six parameters.

These are enough parameters to compensate for manufacturing induced inertia or mechanical spring mismatches, and to produce a resonant structure with the desired modes having no inner baseplate motion. The differential frequency split can be theoretically brought to zero this manner and the resonator mechanical Q can be brought to a value determined solely by the internal losses due to the materials of the post and plate. Another consequence of electrostatic tuning is that the Q is more easily modeled over temperature and will result in greater overall bias stability for the gyroscope.

In a further embodiment of the present invention, the mechanical resonator can be intentionally designed to build in a slight imbalance into the physical structure so that the spring softening can compensate for both over and under manufacturing tolerance errors. For example, the resonator gyroscope 100 described above, the vertical post portion 116 would be slightly too long so that the spring softening (which has greater effect on the outer resonant plate 104) will still be able to compensate for manufacturing errors.

In typical embodiments, the secondary element 126 applies electrostatic balancing or trimming of the isolation of the differential rocking mode from the baseplate 106 (and outer mounting frame 128, discussed hereafter). In a typical embodiment, the secondary element 126 is disposed beneath the support plate portion 118 of a central proof mass 102. Thus, the secondary element also affords independent control of one body (the proof mass 102) from the other body (the counterbalancing plate 104). The secondary element 126, operated in conjunction with the primary element (i.e., the excitation and sense electrodes 120A, 120B beneath the counterbalancing plate 104), permits selective electrostatic control of the differential rocking mode of the gyroscope 100. It should be noted that the use of the secondary element 126 can be applied to other isolated resonator gyroscopes, beyond those employing a central proof mass 102 and counterbalancing plate 104 as detailed herein.

2.2 Integral Baseplate Isolation

In some embodiments of the invention, the baseplate 106 can be a relatively thick silicon plate of rigid material. Such a thick rigid baseplate 106 can be directly bonded to the remainder of the gyroscope in a vacuum package.

Alternatively, a more flexible thin baseplate 106 may be used to reduce cost and ease assembly with standard wafer processing equipment. Common elasticity in the resonator flexures 108 such as in the attachment to the baseplate 106 and finite inertia of the baseplate provides inherent separation of the differential rocking mode frequency from the common rocking mode of vibration. The singular attribute of any of these arrangements is that any external motion of the gyroscope package cannot excite differential rocking motion of the resonator, unless such motion is first internally driven and only then by virtue of Coriolis accelerations due to rotation of the gyroscope about the input axis or axis of inertial symmetry.

However, preferably embodiments of the present invention incorporate integral vibration isolation to the baseplate 106 to further improve differential and common rocking mode frequency separation and vibration isolation of the resonator 124. As discussed above, this technique can provide redundant degrees of freedom which assist in electrostatic tuning of the resonator 124. In these embodiments, a mounting frame 128 is attached to the baseplate 106 through one or more isolation flexures 130. In this case, the baseplate 106 isolation of the resonator 124 is primarily considered with respect to the mounting frame 128 with the baseplate 106 serving as an additional isolating element. For example, the baseplate 106 isolation flexure 130 width and/or length can be set to attenuate axial or rocking vibrations above 500 Hz from the case. In the embodiment shown in FIGS. 1 and 2 the isolating flexures 130 extend around a perimeter of the baseplate 106, attached to the baseplate 106 at a first end and the mounting frame 128 at a second end (illustrating flexures extending around a perimeter as described above). As previously discussed with respect to the resonator flexures 108, radial flexure layouts and hybrids can similarly be used for the isolation flexures 130.

3.0 Producing an Isolated Resonator Gyroscope

Figure 3:
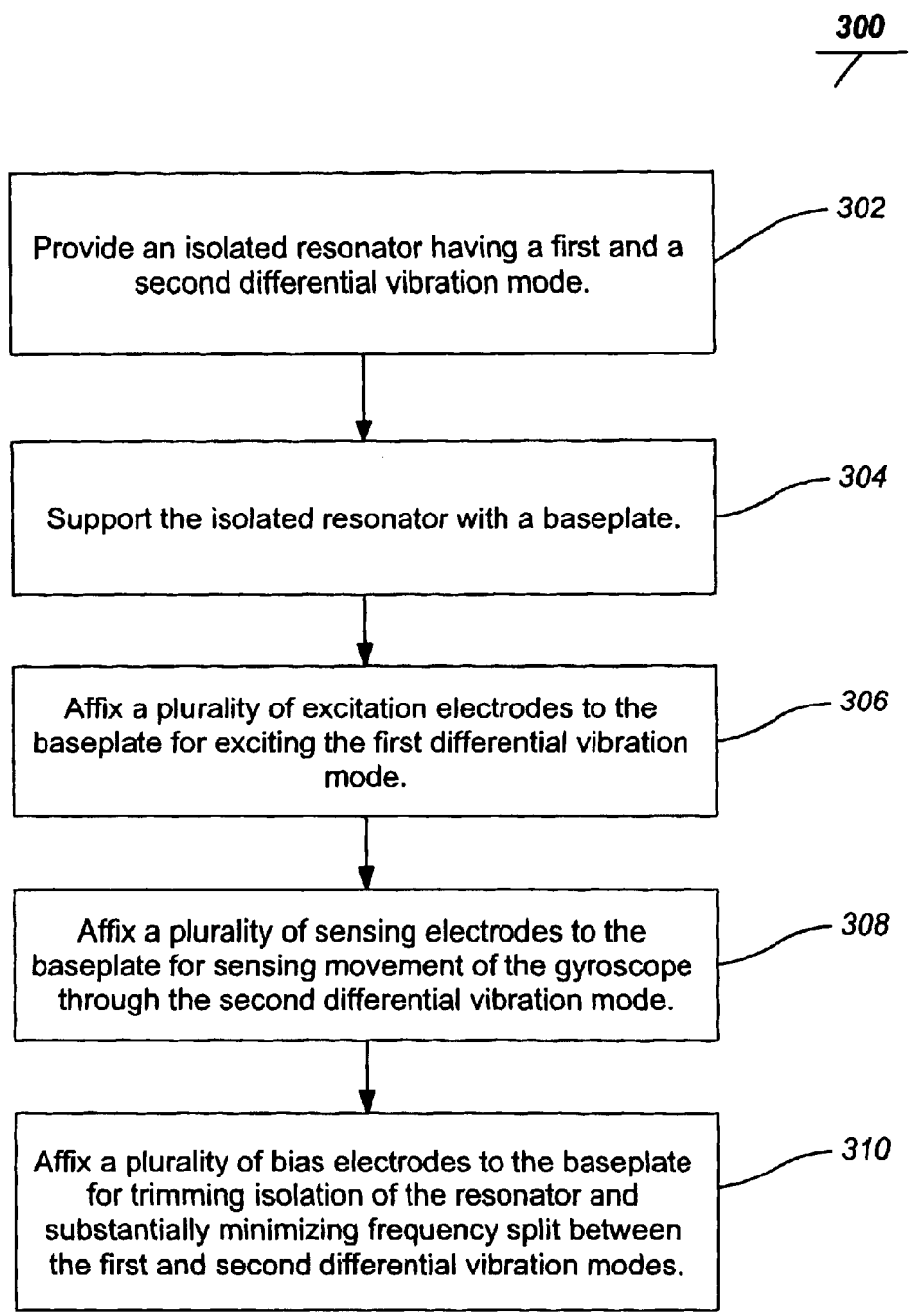
FIG. 3 is a flowchart of a typical method of using the invention.

FIG. 3 is a flowchart of a typical method 300 of producing an isolated resonator gyroscope of the invention. The method comprises providing an isolated resonator 124 having a first and a second differential vibration mode at block 302. The isolated resonator 124 transfers substantially no net momentum to a baseplate 106 when the resonator 124 is excited. Next at block 304, the isolated resonator 124 is supported with a baseplate 106. A plurality of excitation electrodes 120A for exciting the first differential vibration mode of the resonator are affixed to the baseplate 106 at block 306. A plurality of sensing electrodes are affixed to the baseplate 106 for sensing movement of the gyroscope 100 through the second differential vibration mode at block 308. At block 310, a plurality of bias electrodes 126, 136 are affixed to the baseplate 106 for trimming isolation of the resonator 124 and substantially minimizing frequency split between the first and second differential vibration modes.

Providing the isolated resonator 124 may comprise etching the entire proof mass 102 and counterbalancing plate 104 from a single double-side polished crystal silicon wafer or etching only a plate portion 118 and the counterbalancing plate 104 from the silicon and bonding on a separate vertical portion 116 of the proof mass 102. A gold-gold thermocompression bond for a silicon post or anodic bond for a pyrex post can be used with critical precision bonding surfaces and dimensions defined by planar polishing.

The baseplate 106 is also preferably etched from a silicon wafer with standard semiconductor processing. Since the baseplate 106 does not move substantially, by virtue of the disclosed resonator isolation technique, its mechanical precision is of less importance. Electrodes 120, 126, 136 can patterned onto the baseplate 106 using known plating and etching techniques.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the invention. Since many embodiments of the invention can be made without departing from the scope of the invention, the invention resides in the claims hereinafter appended.

What is claimed is:

1. A resonator gyroscope, comprising:

an isolated resonator having a first and a second differential vibration mode;

a baseplate supporting the isolated resonator;

a plurality of excitation electrodes affixed to the baseplate for exciting the first differential vibration mode;

a plurality of sensing electrodes affixed to the baseplate for sensing movement of the gyroscope through the second differential vibration mode; and a plurality of bias electrodes affixed to the baseplate for trimming isolation of the resonator and substantially minimizing frequency split between the first and second differential vibration modes.

2. The resonator gyroscope of claim 1, wherein the isolated resonator provides redundant degrees of freedom in a structure comprising:

an inner resonant post;

an outer resonant plate;

the baseplate supporting the isolated resonator; and baseplate frame.

3. The resonator gyroscope of claim 1, further comprising a mounting frame attached to the baseplate through one or more isolation flexures to provide redundant degrees of freedom to the isolated resonator.

4. The resonator gyroscope of claim 1, wherein the isolated resonator comprises two bodies with transverse inertia symmetry and centers of mass about a substantially coincident axis and the first and second differential vibration modes are transverse to the substantially coincident axis with substantially equal frequencies.

5. The resonator gyroscope of claim 4, wherein the two bodies of the isolated resonator comprise a proof mass and a counterbalancing plate.

6. The resonator gyroscope of claim 5, wherein the sense and excitation electrodes and at least one of the bias electrodes are disposed to react with the counterbalancing plate.

7. The resonator gyroscope of claim 5, further comprising one or more flexures joining the proof mass and the counterbalancing plate and attached to the baseplate.

8. The resonator gyroscope of claim 7, wherein the one or more flexures are arranged around a perimeter of the proof mass, each with a first end attached to the counterbalancing plate and a second end attached to the proof mass.

9. The resonator gyroscope of claim 5, wherein the proof mass comprises a vertical portion attached to a support plate portion elastically connected to the counterbalancing plate.

10. The resonator gyroscope of claim 9, wherein the vertical portion is longer than required to isolate the resonator in the absence of trimming isolation with the plurality of bias electrodes.

11. The resonator gyroscope of claim 9, wherein the vertical portion comprises a post attached to the support plate portion.

12. The resonator gyroscope of claim 9, wherein:
a length of the vertical portion is imbalanced; and
spring softening compensates for the imbalance.

13. The resonator gyroscope of claim 9, wherein at least one of the bias electrodes reacts with the support plate portion.

14. A method of producing a resonator gyroscope, comprising:
providing an isolated resonator having a first and a second differential vibration mode;
supporting the isolated resonator with a baseplate;
affixing a plurality of excitation electrodes to the baseplate for exciting the first differential vibration mode;
affixing a plurality of sensing electrodes to the baseplate for sensing movement of the gyroscope through the second differential vibration mode; and
affixing a plurality of bias electrodes to the baseplate for trimming isolation of the resonator and substantially minimizing frequency split between the first and second differential vibration modes.

15. The method of claim 14, wherein the isolated resonator provides redundant degrees of freedom in a structure comprising:
an inner resonant post;
an outer resonant plate;
the baseplate supporting the isolated resonantor; and
baseplate frame.

16. The method of claim 14, further comprising a mounting frame attached to the baseplate through one or more isolation flexures to provide redundant degrees of freedom to the isolated resonator.

17. The method of claim 14, wherein the isolated resonator comprises two bodies with transverse inertia symmetry and centers of mass about a substantially coincident axis and the first and second differential modes are transverse to the substantially coincident axis with substantially equal frequencies.

18. The method of claim 17, wherein the two bodies of the isolated resonator comprise a proof mass and a counterbalancing plate.

19. The method of claim 18, wherein the sense and excitation electrodes and at least one of the bias electrodes are disposed to react with the counterbalancing plate.

20. The method of claim 18, further comprising one or more flexures joining the proof mass and the counterbalancing plate and attached to the baseplate.

21. The method of claim 20, wherein the one or more flexures are arranged around a perimeter of the proof mass, each with a first end attached to the counterbalancing plate and a second end attached to the proof mass.

22. The method of claim 18, wherein the proof mass comprises a vertical portion attached to a support plate portion elastically connected to the counterbalancing plate.

23. The method of claim 22, wherein the vertical portion is longer than required to isolate the resonator in the absence of trimming isolation with the plurality of bias electrodes.

24. The method of claim 22, wherein the vertical portion comprises a post attached to the support plate portion.

25. The method of claim 22, wherein the resonator isolation is tuned by changing a length of the vertical portion.

26. The method of claim 22, wherein at least one of the bias electrodes reacts with the support plate portion.

* * * * *